US010559685B2

(12) United States Patent
Li et al.

(10) Patent No.: US 10,559,685 B2
(45) Date of Patent: Feb. 11, 2020

(54) VERTICAL FIELD EFFECT TRANSISTOR WITH REDUCED EXTERNAL RESISTANCE

(71) Applicant: International Business Machines Corporation, Armonk, NY (US)

(72) Inventors: Juntao Li, Cohoes, NY (US); Kangguo Cheng, Schenectady, NY (US); Choonghyun Lee, Rensselaer, NY (US); Peng Xu, Santa Clara, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/007,263

(22) Filed: Jun. 13, 2018

(65) Prior Publication Data

US 2019/0386135 A1     Dec. 19, 2019

(51) Int. Cl.
| | |
|---|---|
| *H01L 21/00* | (2006.01) |
| *H01L 29/78* | (2006.01) |
| *H01L 27/088* | (2006.01) |
| *H01L 29/66* | (2006.01) |
| *H01L 29/08* | (2006.01) |
| *H01L 29/45* | (2006.01) |

(Continued)

(52) U.S. Cl.
CPC .... *H01L 29/7827* (2013.01); *H01L 21/76889* (2013.01); *H01L 27/088* (2013.01); *H01L 29/0847* (2013.01); *H01L 29/456* (2013.01); *H01L 29/6656* (2013.01); *H01L 29/66666* (2013.01); *H01L 21/823431* (2013.01); *H01L 21/823821* (2013.01); *H01L 21/845* (2013.01); *H01L 27/0886* (2013.01); *H01L 27/0924* (2013.01); *H01L 27/1211* (2013.01)

(58) Field of Classification Search
CPC ......... H01L 29/7827; H01L 21/823431; H01L 21/823821; H01L 21/845; H01L 27/0886; H01L 27/0924; H01L 27/1211
See application file for complete search history.

(56) References Cited

U.S. PATENT DOCUMENTS

| | | | | |
|---|---|---|---|---|
| 8,076,717 B2* | 12/2011 | Sandhu | ............... | H01L 29/7827 257/296 |
| 8,253,191 B2* | 8/2012 | Sandhu | ............... | H01L 29/7827 257/288 |

(Continued)

FOREIGN PATENT DOCUMENTS

JP         2012004473         1/2012

*Primary Examiner* — Nicholas J Tobergte
(74) *Attorney, Agent, or Firm* — Fleit Intellectual Property Law; Thomas S. Grzesik

(57) ABSTRACT

A semiconductor structure and a method for fabricating the same. The semiconductor structure includes a substrate and at least one semiconductor fin contacting the substrate. A first source/drain layer contacts the substrate. A silicide contacts and wraps around the first source/drain layer. The structure also includes a second source/drain layer above the first source/drain layer. The method comprises forming a structure including at least a substrate, a first source/drain layer, and at least one semiconductor fin disposed on and in contact with substrate. A silicide is formed in contact with and wrapping around the first source/drain layer. A gate structure is formed in contact with at least the at least one semiconductor fin. A second source/drain layer is formed above the first source/drain layer.

20 Claims, 16 Drawing Sheets

(51) Int. Cl.
*H01L 21/768* (2006.01)
*H01L 21/8234* (2006.01)
*H01L 27/12* (2006.01)
*H01L 21/8238* (2006.01)
*H01L 21/84* (2006.01)
*H01L 27/092* (2006.01)

(56) References Cited

U.S. PATENT DOCUMENTS

| | | | |
|---|---|---|---|
| 8,421,164 B2 * | 4/2013 | Sandhu | H01L 27/1021 257/329 |
| 8,648,428 B2 * | 2/2014 | Sandhu | H01L 27/1021 257/329 |
| 8,981,463 B2 * | 3/2015 | Sandhu | H01L 27/1021 257/329 |
| 9,299,835 B1 | 3/2016 | Anderson et al. | |
| 9,368,572 B1 * | 6/2016 | Cheng | H01L 29/7827 |
| 9,716,143 B2 | 7/2017 | Yang et al. | |
| 9,773,913 B1 | 9/2017 | Balakrishnan et al. | |
| 9,799,751 B1 * | 10/2017 | Zhang | H01L 29/66666 |
| 9,805,935 B2 * | 10/2017 | Anderson | H01L 21/28518 |
| 9,853,127 B1 * | 12/2017 | Anderson | H01L 29/66666 |
| 9,887,289 B2 * | 2/2018 | Ok | H01L 29/7845 |
| 9,934,977 B1 | 4/2018 | Adusumilli et al. | |
| 9,972,537 B2 * | 5/2018 | Jacob | H01L 21/823814 |
| 10,074,727 B2 * | 9/2018 | Adusumilli | H01L 29/45 |
| 10,096,606 B1 * | 10/2018 | Zang | H01L 29/785 |
| 10,103,247 B1 * | 10/2018 | Xie | H01L 29/66545 |
| 10,147,650 B2 * | 12/2018 | Kim | H01L 21/823871 |
| 10,211,339 B2 * | 2/2019 | Heo | H01L 28/00 |
| 10,418,462 B2 * | 9/2019 | Anderson | H01L 29/6653 |
| 2016/0013312 A1 | 1/2016 | Fujimoto | |
| 2016/0211338 A1 * | 7/2016 | Wang | H01L 21/823481 |
| 2016/0336329 A1 * | 11/2016 | Colinge | H01L 27/1104 |
| 2017/0194155 A1 * | 7/2017 | Anderson | H01L 21/28518 |
| 2017/0316945 A1 * | 11/2017 | Anderson | H01L 21/28518 |
| 2018/0006118 A1 | 1/2018 | Mallela et al. | |
| 2018/0033868 A1 * | 2/2018 | Anderson | H01L 29/66666 |
| 2018/0068857 A1 * | 3/2018 | Adusumilli | H01L 21/28518 |

* cited by examiner

VERTICAL FIELD EFFECT TRANSISTOR WITH REDUCED EXTERNAL RESISTANCE

BACKGROUND OF THE INVENTION

The present disclosure generally relates to the field of semiconductors, and more particularly relates to vertical field effect transistors with reduced external resistance.

Vertical field effect transistors (VFETs) are becoming viable device options for semiconductor devices, for example, complementary metal oxide semiconductor (CMOS) devices, beyond 5 nanometer (nm) node. VFET devices include fin channels with source/drain regions at ends of the fin channels on top and bottom sides of the fins. Current runs through the fin channels in a vertical direction (e.g., perpendicular to a substrate), for example, from a bottom source/drain region to a top source/drain region. Vertical transport architecture devices are designed to extend the product value proposition beyond conventional plateaus and address the limitations of horizontal device architectures by, for example, decoupling of gate length from the contact gate pitch. Vertical transistors may provide higher density scaling and allow for relaxed gate lengths to better control device electrostatics, without sacrificing the gate contact pitch size.

SUMMARY OF THE INVENTION

In one embodiment, a method for forming a semiconductor structure is disclosed. The method comprises at least the following operations. A structure comprising at least a substrate, a first source/drain layer, and at least one semiconductor fin disposed on and in contact with substrate is formed. A silicide is formed in contact with and wrapping around the first source/drain layer. A gate structure is formed in contact with at least the at least one semiconductor fin. A second source/drain layer is formed above the first source/drain layer.

In another embodiment, a semiconductor structure is disclosed. The semiconductor structure comprises at least a substrate and at least one semiconductor fin contacting the substrate. A first source/drain layer contacts the substrate. A silicide contacts and wraps around the first source/drain layer. The semiconductor structure also includes a second source/drain layer above the first source/drain layer.

In yet another embodiment, an integrated circuit is disclosed. The integrated circuit comprises one or more semiconductor devices. At least one of the one or more semiconductor devices comprises at least a substrate; at least one semiconductor fin contacting the substrate; a first source/drain layer contacting the substrate; a silicide contacting and wrapping around the first source/drain layer; and a second source/drain layer above the first source/drain layer.

BRIEF DESCRIPTION OF THE DRAWINGS

The accompanying figures where like reference numerals refer to identical or functionally similar elements throughout the separate views, and which together with the detailed description below are incorporated in and form part of the specification, serve to further illustrate various embodiments and to explain various principles and advantages all in accordance with the present invention, in which.

DETAILED DESCRIPTION

Figure 1:
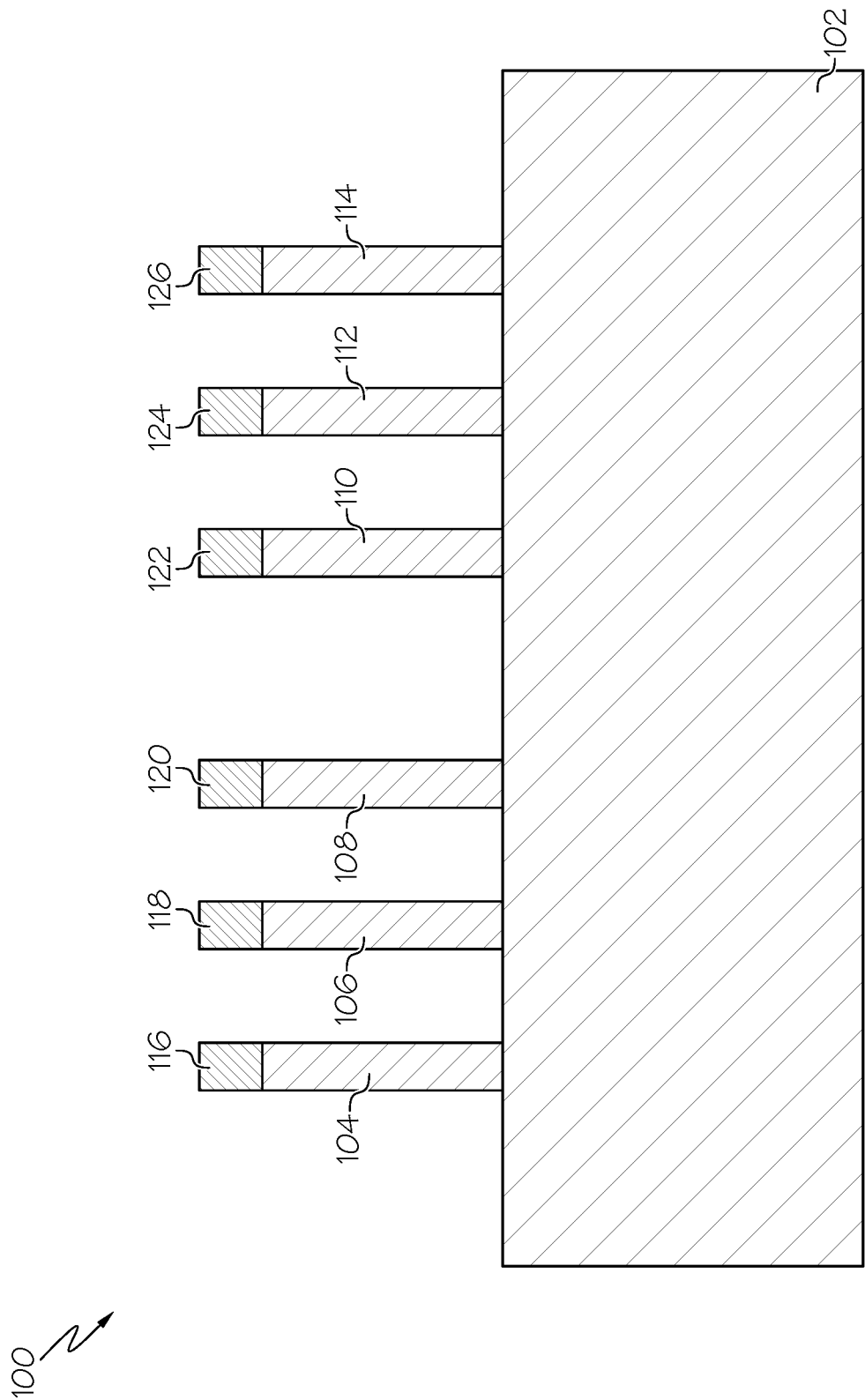
FIG. 1 is a cross-sectional view of a semiconductor structure after a plurality of fin structures have been formed on a substrate according one embodiment of the present disclosure.

Vertical transistors may provide higher density scaling and allow for relaxed gate lengths to better control device electrostatics, without sacrificing the gate contact pitch size. However, with ever decreasing device dimensions, forming the individual components and electrical contacts become more difficult. Conventional VFETs have a drawback of high contact resistance between the bottom source/drain region and the metal contact. More specifically, the silicide is only present at the interface between bottom source and conductive metal, resulting high conductive resistance.

Therefore, there is a need for VFET with reduced external resistance at the bottom source/drain region.

Embodiments of the present invention overcome the above problems by fabricating VFETs with a wrap-around silicide at the bottom source/drain of the VFET to reduce the external resistance at the bottom source/drain region. By wrapping the silicide around the bottom source/drain the contact resistance of the bottom source/drain is reduced as compared to conventional VFETS having silicide on just the top surface of the bottom source/drain.

It is to be understood that the present disclosure will be described in terms of a given illustrative architecture; however, other architectures, structures, substrate materials and process features and steps may be varied within the scope of the present disclosure.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present disclosure may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

Referring now to the drawings in which like numerals represent the same or similar elements, FIG. 1 shows a semiconductor structure 100 at a given point in the fabrication process. For example, FIG. 1 shows a substrate 102 having a plurality of fin structures 104 to 114 formed on and in contact with the substrate 102. In some embodiments, the substrate 102 is a bulk substrate. In other embodiments, the substrate is a silicon-on-insulator (SOI) substrate. In this example, an optional dielectric layer (e.g., a BOX layer or oxide layer) overlies the substrate, and the fin structures 104 to 114 are formed on and in contact with the dielectric layer.

The optional dielectric layer may be formed from any of several dielectric materials. Non-limiting examples include, for example, oxides, nitrides and oxynitrides of silicon. The dielectric layer may also include oxides, nitrides and oxynitrides of elements other than silicon. In addition, the dielectric layer may include crystalline or non-crystalline dielectric material. Moreover, the dielectric layer may be formed using any of several methods. Non-limiting examples include ion implantation methods, thermal or plasma oxidation or nitridation methods, chemical vapor deposition methods and physical vapor deposition methods. The dielectric layer may include a thickness ranging from about 5 nm to about 200 nm. In one embodiment, the dielectric layer may be about 25 nm thick.

In one embodiment, the substrate 102 may comprise at least one of Si, Ge alloys, SiGe, GaAs, InAs, InP, SiCGe, SiC, and other III/V or II/VI compound semiconductors. The substrate 102 may be appropriately doped either with p-type dopant atoms and/or with n-type dopant atoms, or the material can be substantially undoped (intrinsic). The fin structures 104 to 114 may comprise a semiconductor material such as Si, SiGe, and/or the like. In an embodiment where the fins structures are formed on an SOI substrate, the fin structures and the substrate can be made of the same or different materials.

In an SOI embodiment, the semiconductor material/layer from which the fin structures 104 to 114 are fabricated may be formed utilizing various methods such as a layer transfer process including a bonding step, or an implantation process such as SIMOX (Separation by IMplantation of OXygen). This semiconductor material/layer nay be undoped or doped with either p-type or n-type dopants through ion implantation, plasma doping, or gas phase doping. P-type transistors are produced by doping the semiconductor material/layer with elements from group III of the periodic table (e.g., boron, aluminum, gallium, or indium). As an example, the dopant can be boron in a concentration ranging from 1×10E18 atoms/cm3 to 2×10E21 atoms/cm3. N-type transistors are produced by doping the semiconductor material/layer with elements from group V of the periodic table (e.g., phosphorus, antimony, or arsenic).

The fin structures 104 to 114 may be formed by forming an etch-stop capping layer 116 to 126 onto or semiconductor layer (or substrate) through, for example, deposition. The etch-stop capping layer, in one embodiment, may be made of silicon-nitride although other material suitable in providing etch-stop function may be used as well. The fin structures 104 to 114 are subsequently formed or etched out of the semiconductor layer (or substrate 102) through a process involving masking, using industry-standard lithographic techniques, and directionally etching (e.g., RIE) the etch-stop capping layer and underneath semiconductor layer (or substrate 102). After the RIE etching process, the photoresist mask used in the lithographic etching process may be removed, leaving the fin structures 104 to 114. In some embodiments, there may be different pitches between two or more of the fin structures 104 to 114 to define different devices.

Figure 2:
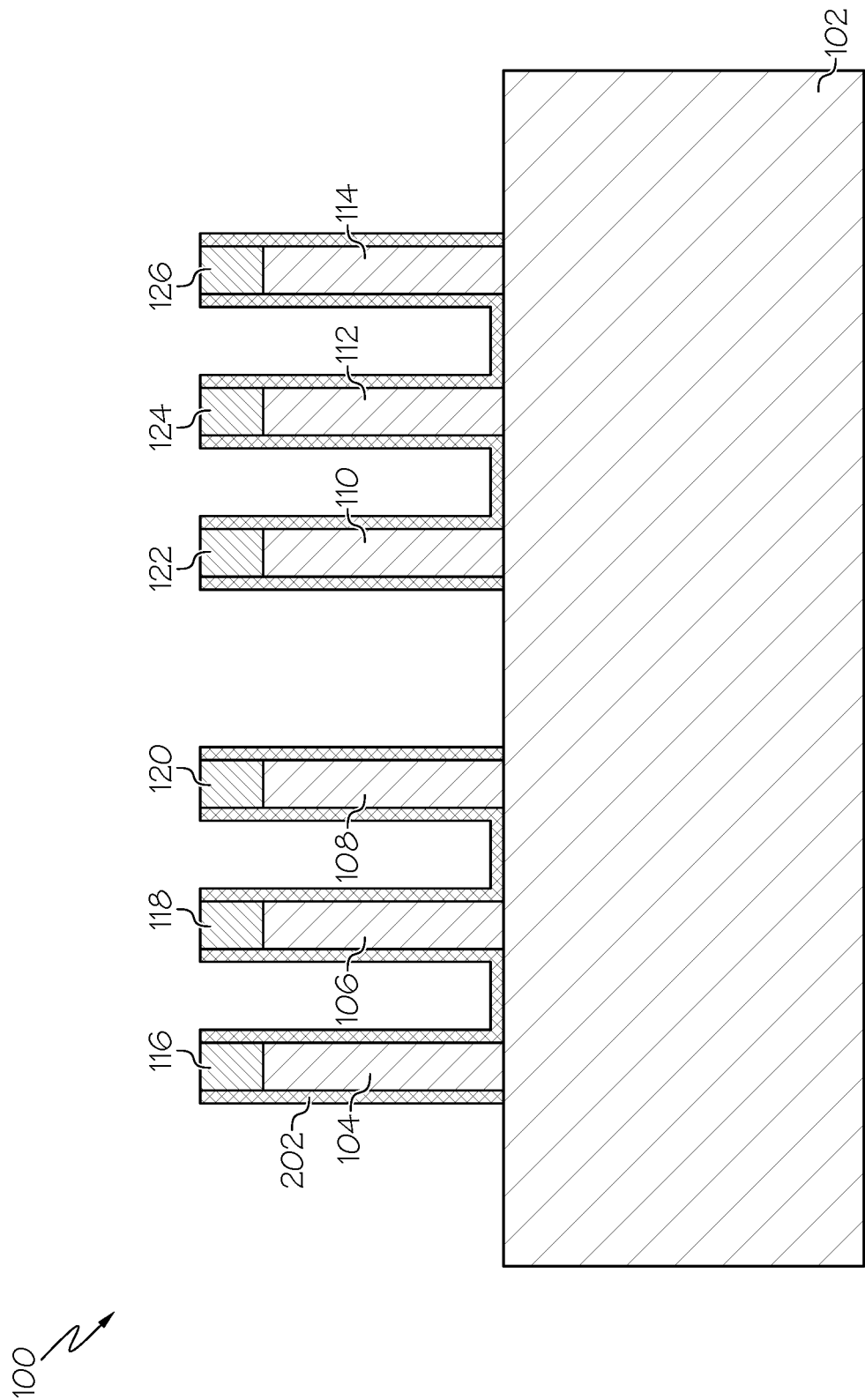
FIG. 2 is a cross-sectional view of the semiconductor structure after a protective layer has been performed in contact with the plurality of fin structures according one embodiment of the present disclosure.

After forming multiple fins structures 104 to 114, a protective layer 202 is formed on and in contact with the fin structures, as shown in FIG. 2. In one embodiment, a protective layer material such as (but not limited to) silicon nitride is deposited over the structure. Then, an anisotropic etch (e.g., reactive ion etch (RIE)) is performed to remove the protective layer material from horizontal surfaces of the structure that are not situated between fins 104 to 114. This leaves the protective layer material on and in contact with the sidewalls of the fin structures 104 to 114; on and in contact with portions of the substrate between the fin structures 104 to 114; and sidewalls for the etch-stop capping layers 116 to 126. Protective layer material may remain on and in contact with portions of the substrate between the fin structures 104 to 114 due to the loading effect of the anisotropic etc.

Figure 3:
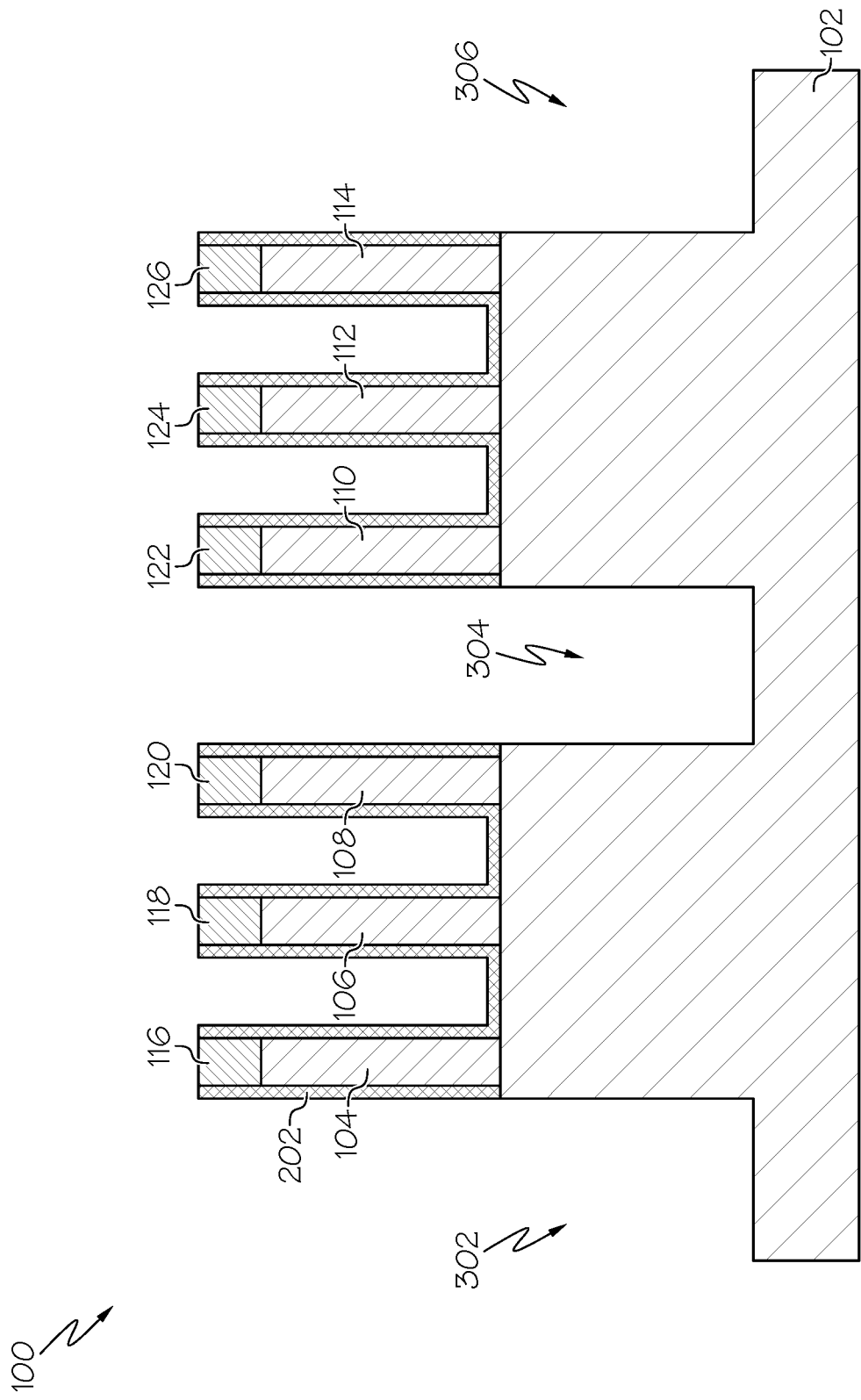
FIG. 3 is a cross-sectional view of the semiconductor structure after the substrate has been recessed according one embodiment of the present disclosure.
Figure 4:
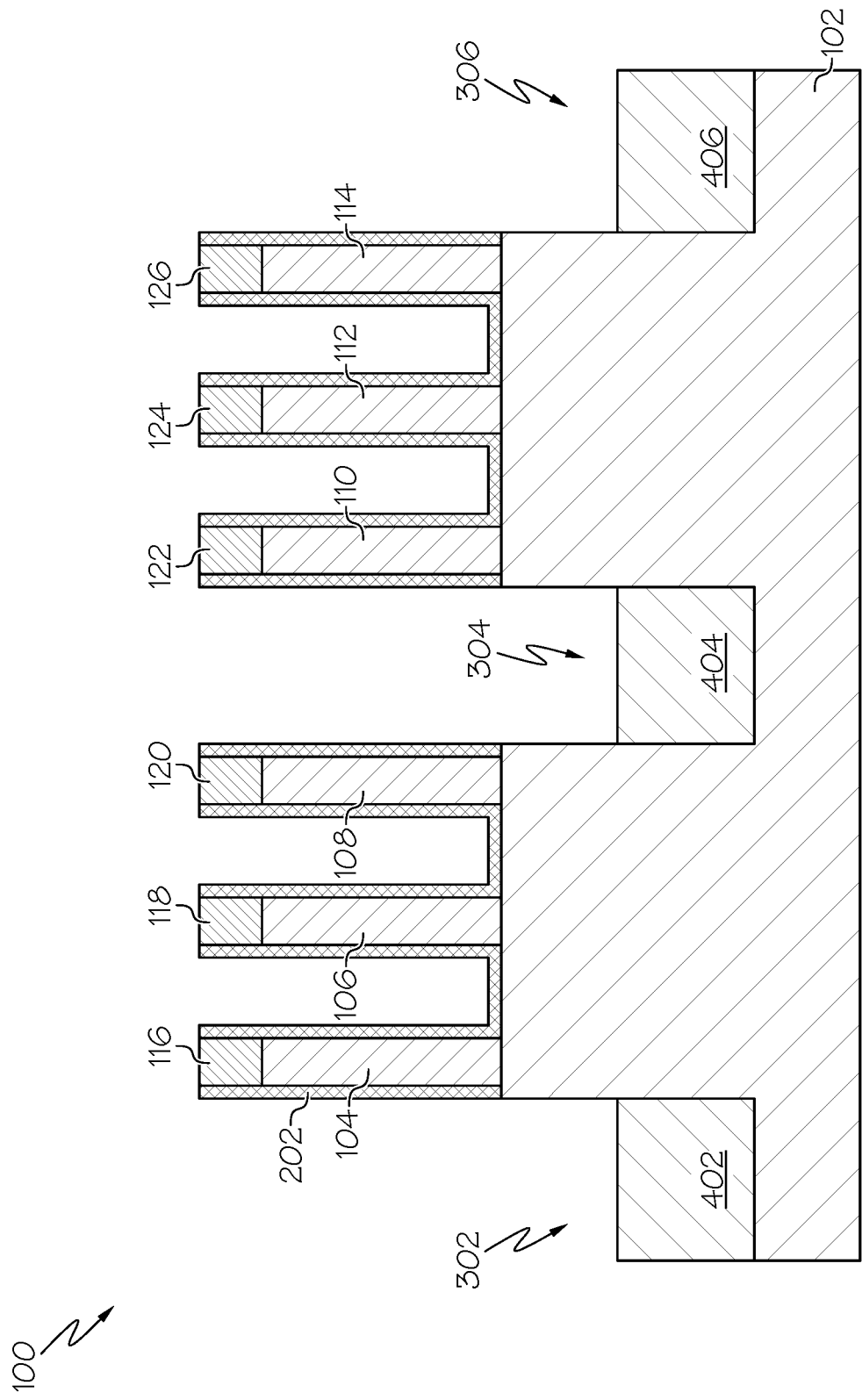
FIG. 4 is a cross-sectional view of the semiconductor structure after isolation regions have been formed according one embodiment of the present disclosure.

Once the protective layer 202 has been formed, portions of the substrate 102 not underlying the protective layer 202 are recessed to form recessed areas 302, 304, 306 of the substrate 102, as shown in FIG. 3. In one embodiment, directional RIE may be used to recess the substrate 102. FIG. 4 shows that isolation regions 402, 404, 406 are then formed within the recessed areas 302, 304, 306 to isolate the various devices from each other. In some embodiments, an insulating film (e.g. silicon dioxide) is deposited to form the isolation regions 402, 404, 406 for device isolation. These structures are may obtained by depositing the insulating film, followed by a recess process using RIE or wet etching. In some embodiments, a top surface of the isolation regions 402, 404, 406 is below a top surface of the substrate 102.

Figure 5:
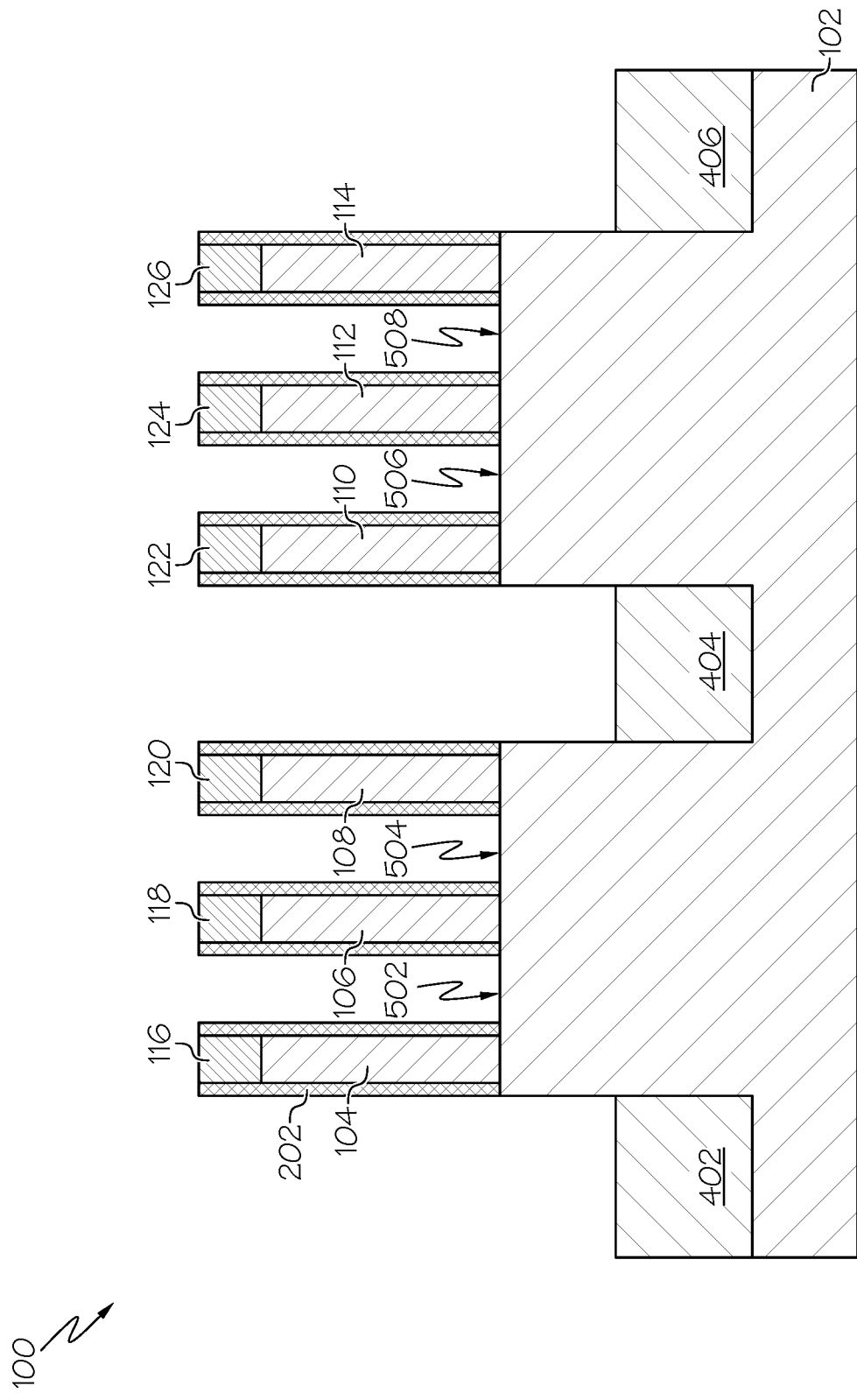
FIG. 5 is a cross-sectional view of the semiconductor structure after portions of the protective layer between the plurality of fins have been removed according one embodiment of the present disclosure.
Figure 6:
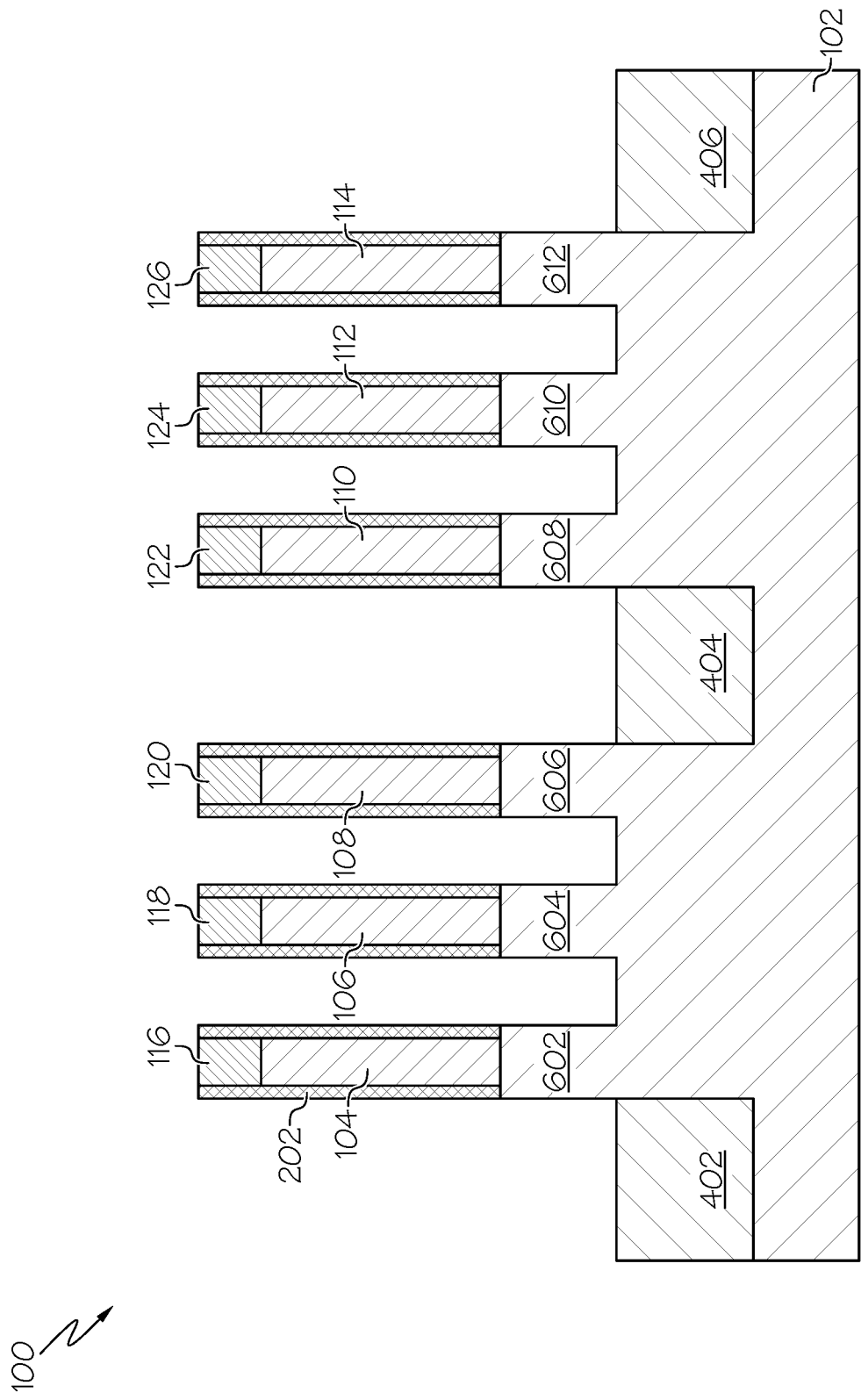
FIG. 6 is a cross-sectional view of the semiconductor structure after pillar structures have been formed for the plurality of fins according one embodiment of the present disclosure.

After the isolation regions 402, 404, 406 have been formed, portions of the protective layer 202 on planar surfaces between the fin structures 104 to 114 are removed, as shown in FIG. 5. This process exposes portions 502 to 508 of the substrate 102 between the areas of the fin structures 104 to 114. In one embodiment, an etching process such as RIE may be used to remove these portions of the protective layer 202. These portions 502 to 508 of the substrate 102 are then recessed to form pillar structures 602 to 612 under each fin structure 104 to 114, as shown in FIG. 6. In one embodiment, the portions 502 to 508 of the substrate 102 are recessed to be co-planar with the isolation regions 402, 404, 406. However, other recess dimensions are applicable as well.

Figure 7:
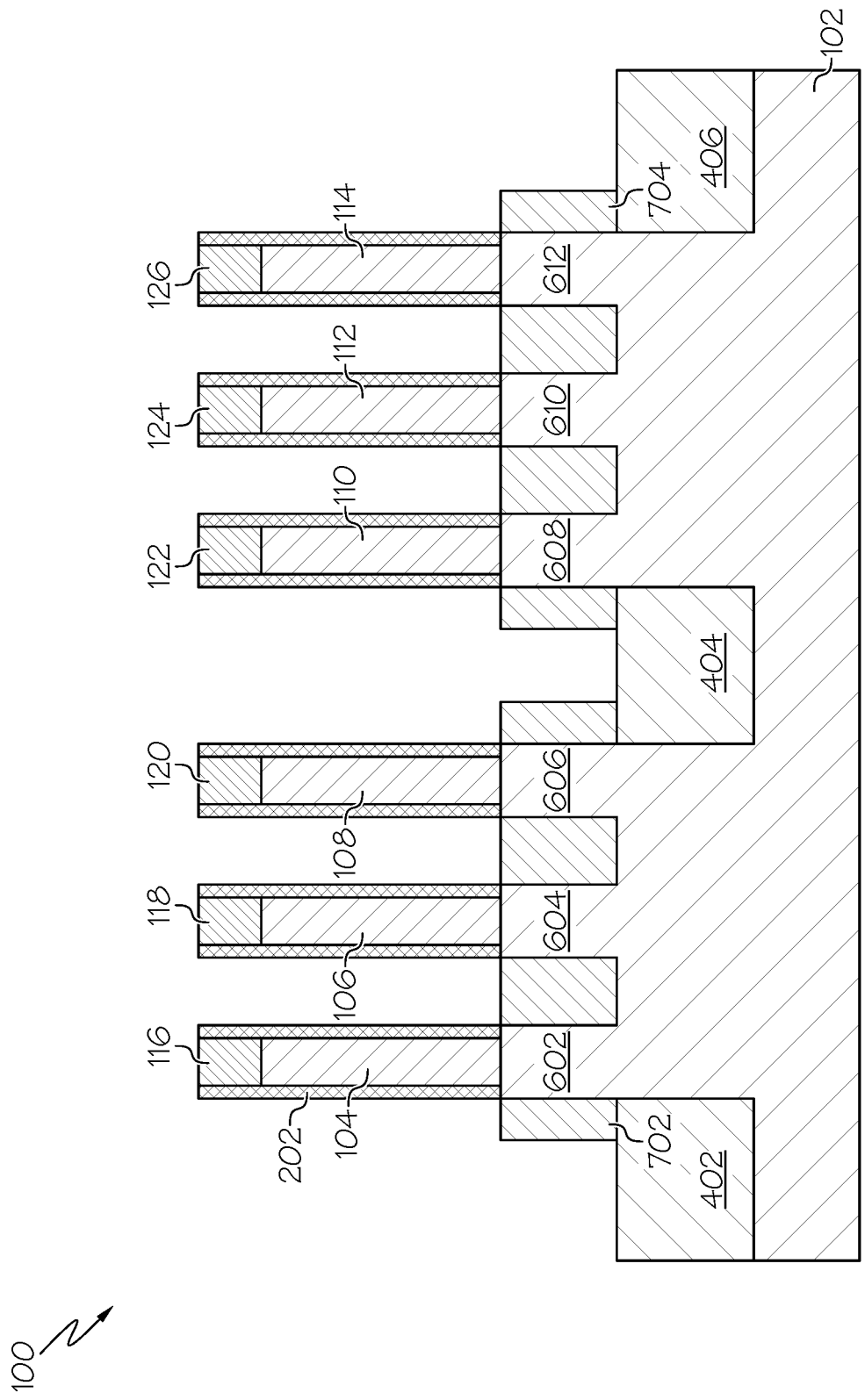
FIG. 7 is a cross-sectional view of the semiconductor structure after a bottom source/drain layer has been formed according one embodiment of the present disclosure.

Bottom source/drain layers 702, 704 are formed on and in contact with the substrate 102 for each device structure, as shown in FIG. 7. For example, the bottom source/drain layers 704, 604 may be formed in contact with a top surface of the portions of the substrate between each pillar structures 602 to 612 of their respective device structure. The bottom source/drain layers 702, 704 may also be formed on and in contact with the sidewalls of their respective pillar structures 602 to 612. The bottom source/drain layers 702, 704 may wrap around their respective pillar structures 602 to 612. In some embodiments, at least a portion of the bottom source/drain layers 702, 704 may contact a top surface of the isolation regions 402, 404, 406 as well. In one embodiment, the top surface of the bottom source/drain layers 702, 704 are co-planar with a top surface may of their respective pillar structures 602 to 612. It should be understood that the bottom source/drain layers 702, 704 may be either one of a source or a drain layer, as appropriate. Example materials for the bottom source/drain layers 702, 704 include (but are not limited to) phosphorus doped silicon epitaxy for an nFET device and boron doped silicon germanium epitaxy for a pFET device.

In one embodiment, the bottom source/drain layers 702, 704 may have a thickness of about 10 nm to about 100 nm. However, other thicknesses are applicable as well. The bottom source/drain layer 702, 704 may be doped with dopant atoms. The dopant atoms may be an n-type dopant (i.e., an element from Group IV or VI of the Periodic Table of Elements) or a p-type dopant (i.e., an element from Group II or VI of the Periodic Table of Elements). Exemplary n-type dopants for a group IV semiconductor include phosphorus, arsenic and antimony. Exemplary p-type dopants for a group IV semiconductor include boron, aluminum, and gallium. Exemplary n-type dopants for a III-V semiconductor include selenium, tellurium, silicon, and germanium. Exemplary p-type dopants for a III-V semiconductor include beryllium, zinc, cadmium, silicon, and germanium.

In some embodiments, the bottom source/drain layers 702, 704 are formed by epitaxial growth of a semiconductor material. The terms "epitaxially growing", "epitaxial growth", "epitaxially grown", and their variants mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation. In some embodiments, epitaxial growth and/or deposition processes are selective to forming on semiconductor surface, and do not deposit material on dielectric surfaces, such as silicon dioxide or silicon nitride surfaces.

Examples of various epitaxial growth process apparatus that are suitable for use in one or more embodiments include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). A number of different sources can be used for the deposition of the various layers discussed herein. For example, the gas source for the deposition of epitaxial semiconductor material can include a silicon containing gas source, a germanium containing gas source, a carbon containing gas source, or a combination thereof. Examples of silicon containing gas sources are silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane, and combinations thereof. Examples of germanium containing gas sources are germane, digermane, halogermane, dichlorogermane, trichlorogermane, tetrachlorogermane and combinations thereof.

Figure 8:
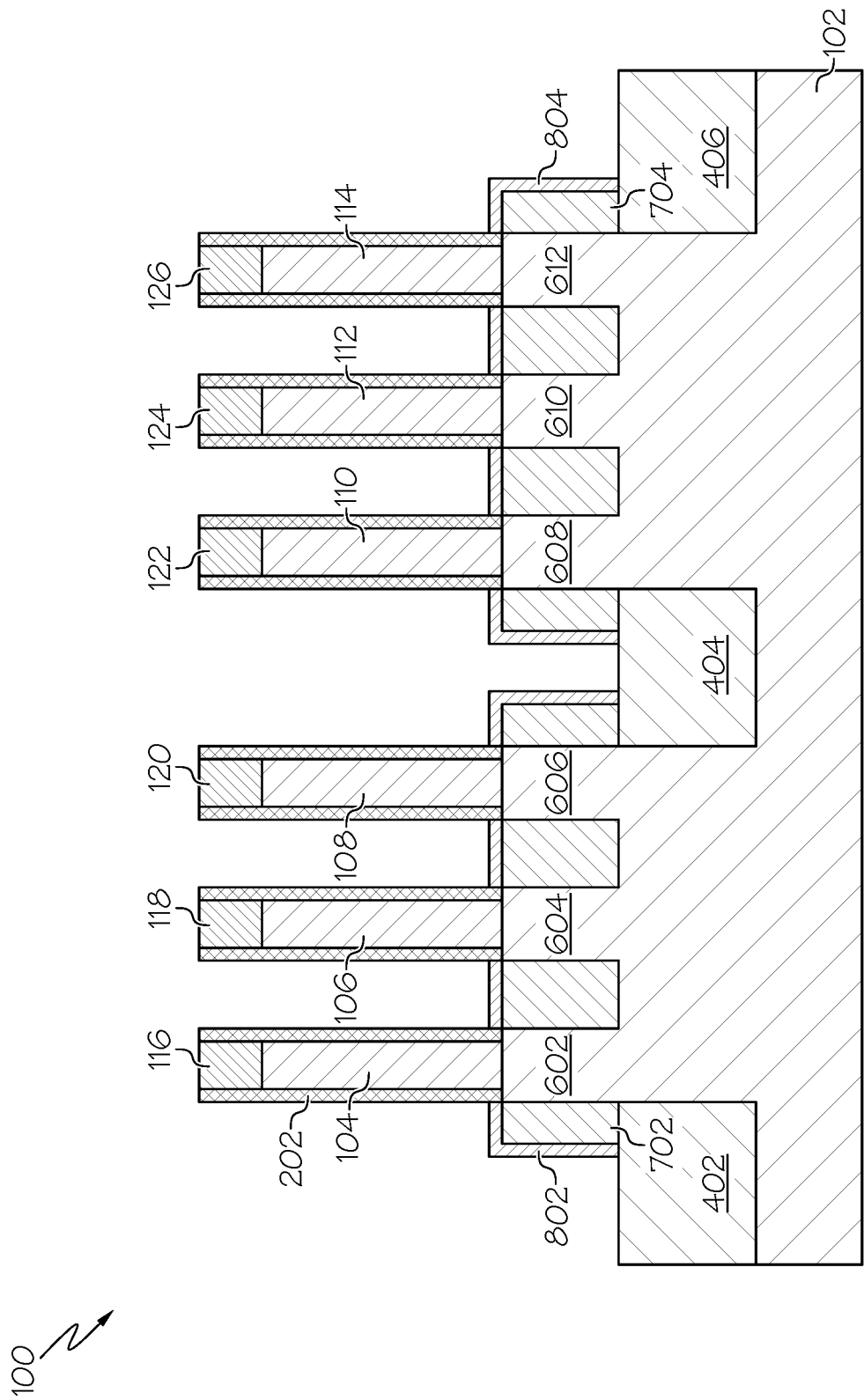
FIG. 8 is a cross-sectional view of the semiconductor structure after silicide has been formed contacting and wrapping around the bottom source/drain layer according one embodiment of the present disclosure.

A silicide layer 802, 804 is then formed on and in contact with each bottom source/drain 702, 704, as shown in FIG. 8.

In one embodiment, the silicide layers 802, 804 wrap round each of their bottom source/drain 702, 704. For example, the silicide layers 802, 804 are formed on and in contact with all sidewalls of their bottom source/drain 702, 704 and the top surface of their bottom source/drain 702, 704. FIG. 8 further shows that the silicide layers 802, 804 are also formed in contact with a portion of the protective layer 202 formed on their respective fin structures 104 to 114.

In some embodiments, the silicide layers 802, 804 may be formed by depositing one or more metal/metallic layers over the entire structure. Non-limiting examples of candidate silicide forming metals include nickel, cobalt, titanium, tungsten, erbium, ytterbium, platinum and vanadium silicide forming metals. Titanium, nickel, and cobalt silicide forming metals are particularly common. Typically, the silicide layers are formed using a salicide method. The salicide method may include: (1) forming a blanket silicide forming metal layer upon the semiconductor structure; (2) thermally annealing the blanket silicide forming metal layer with silicon surfaces which it contacts to selectively form the silicide layers while leaving unreacted metal silicide forming metal layers on dielectric; and (3) selectively stripping unreacted portions of the silicide forming metal layers from the dielectric. Typically, the silicide layers comprise a silicide material (e.g., tatanium silicide, nickel silicide, or cobalt silicide) that has a thickness from about 5 to about 30 nanometers, although lesser and greater thickness is also explicitly contemplated herein. In one embodiment, the sheet resistance of the material(s) used for the contact metal/metallic layer(s) is less than 100 Ohm/squareIn one embodiment, the contact resistance between the silicide and the underlying doped semiconductor is less than 1E-8 ohm·cm$^2$. In another embodiment, the metal/metallic layer comprises one or more high melting point (e.g., greater than 1500° C.) refractory metals such as platinum (Pt), molybdenum (Mo), ruthenium (Ru), vanadium (Va), tungsten (W), or the like.

An anneal is then performed to form a silicide layer 802, 804. The silicide is formed in contact with and wraps around all exposed sides of the bottom source/drains 702, 704 resulting from the reaction of the metallic/metal layer(s) with the material of the bottom source/drain 702, 704. In one embodiment, the thickness of the silicide is 5 nm to 30 nm depending on the phase of the silicide. The result of the anneal are silicides of Ti, Ni, Co, Ni, Pt and/or the like. In one embodiment, the silicides 802, 804 comprise carbon for enhanced agglomeration resistance. The anneal may be performed at temperature ranging from, for example, 400° C. to 700° C. Unreacted metal is then selectively removed from the structure 100. In some embodiments, different silicides may be formed in nFET region and pFET region to independently reduce the resistance in nFET region and pFET region. For example, titanium silicide may be formed in nFET region and nickel platinum silicide can be formed in pFET region.

Figure 9:
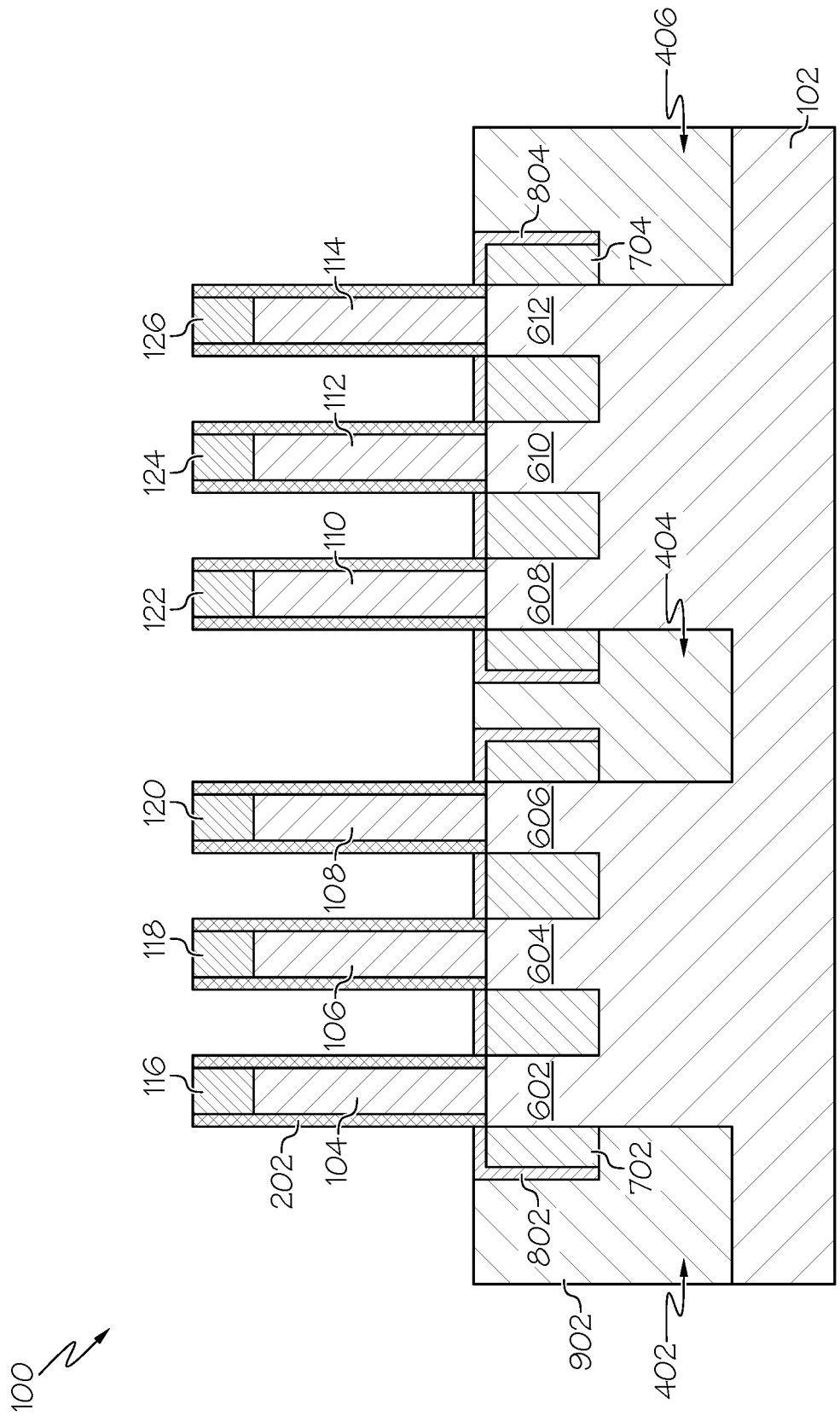
FIG. 9 is a cross-sectional view of the semiconductor structure after an insulating layer has been formed according one embodiment of the present disclosure.

After the silicide 802, 804 has been formed on the bottom source/drains 702, 704, an insulating material 902 (e.g., oxide) is deposited over the structure and etched backed, as shown in FIG. 9. In one embodiment, the insulating material 902 is etched back so that it only remains on the top surface of the isolation regions 402, 404, 406 and sidewalls of the silicide 802, 804. The insulating material 902 extends isolation regions 402, 404, 406 such that a top surface of the isolation regions 402, 404, 406 is co-planar with a top surface of the silicide 802, 804.

Figure 10:
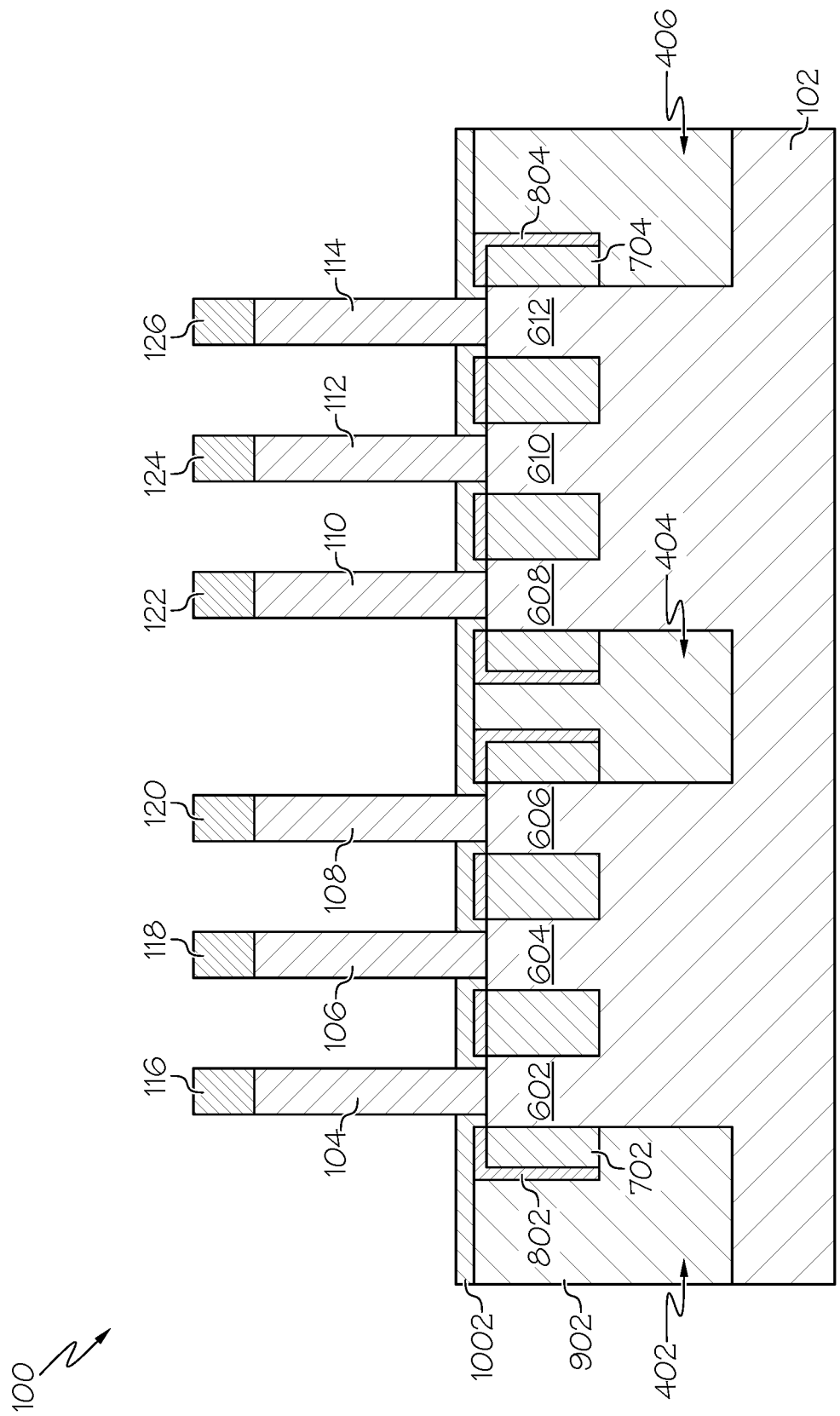
FIG. 10 is a cross-sectional view of the semiconductor structure after the protective layer has been removed and a bottom spacer layer has been formed according one embodiment of the present disclosure.

The protective layers 202 are then removed from the fin structures 104 to 114, as shown in FIG. 10. A selective etching process such as RIE may be used to remove the protective layers 202 from the fin structures 104 to 114. The removal of the protective layers 202 exposes a portion of the top surface of the substrate pillar structures 602 to 612 and creates gaps between the silicide 802, 804 and sidewalls of the fin structures 104 to 114. In some embodiments, the gap is not created and a portion of the protective layer 202 remains between the silicide 802, 804 and the fin structures 104 to 114. FIG. 10 also shows that after the protective layers 202 have been removed, a bottom spacer layer 1002 is formed in contact with each of the remaining fin structures 104 to 114; the exposed top surface of the substrate pillar structures 602 to 612; the top surface of the silicide 802, 804; exposed sidewalls of the silicide 802, 804 previously in contact with the protective layers 202; and a top surface of the isolation regions 402, 404, 406.

In one embodiment, the bottom spacer 1002 comprises an insulating material (such as silicon oxide, silicon nitride, silicon oxynitride, silicon boron nitride, siliconborocarbonitride (SiBCN), silicon oxycarbonitride (SiOCN), or a combination of these) and may be formed using, for example, directional deposition techniques, including, but not necessarily limited to high density plasma (HDP) deposition and gas cluster ion beam (GCIB) deposition. The directional deposition deposits the spacer material preferably on the exposed horizontal or nearly horizontal surfaces, but not on lateral sidewalls. Spacer material formed on the capping layers 116-126 (not shown) will later be removed during subsequent planarization step. In one embodiment, the spacers have a thickness of, for example, 3 nm to 30 nm.

Figure 11:
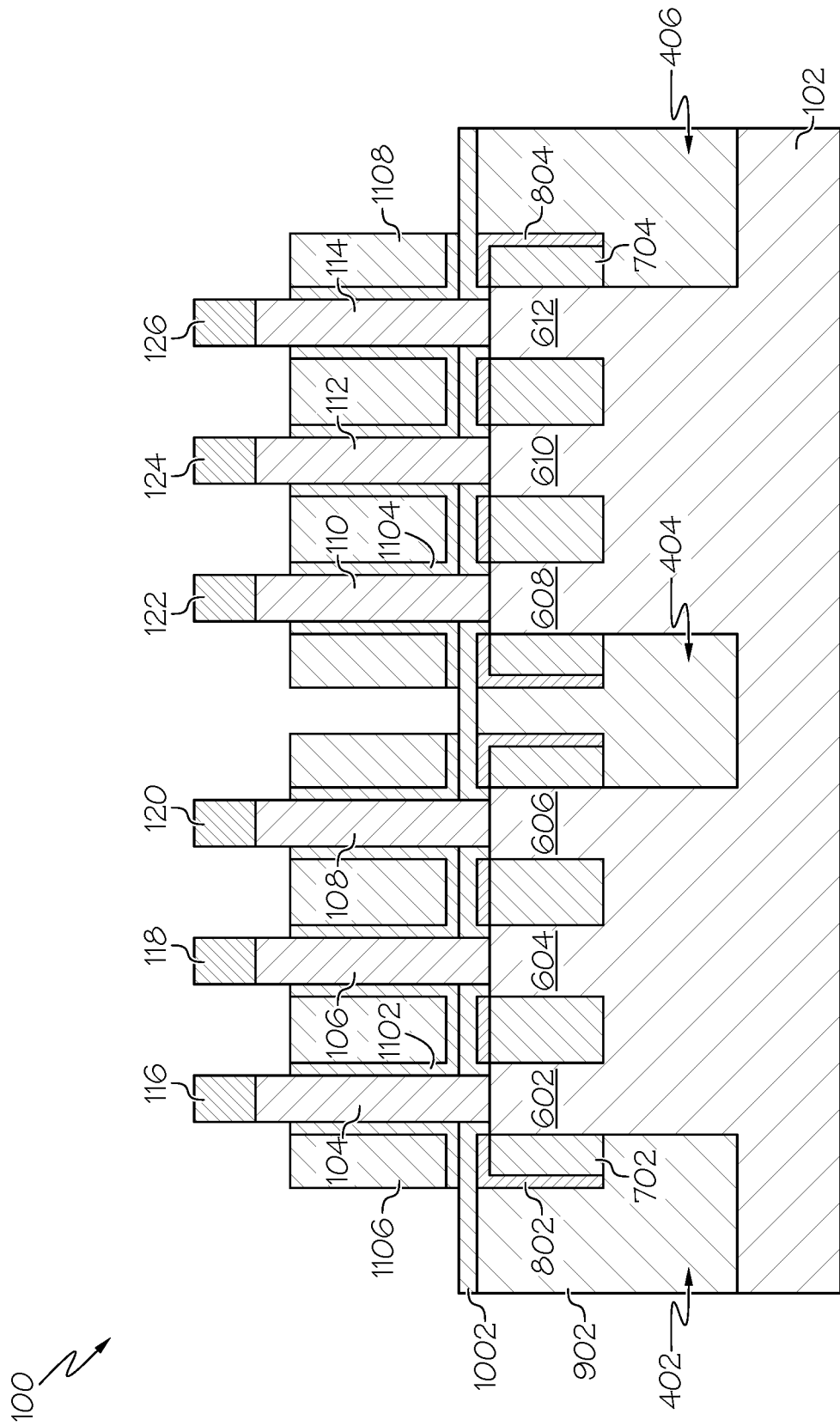
FIG. 11 is a cross-sectional view of the semiconductor structure one or more gate structures have been formed according one embodiment of the present disclosure.

A high-k dielectric material 1002 is then blanket deposited over the entire structure 100. Deposition processes such as (but not limited to) CVD (chemical vapor deposition), PECVD (plasma enhanced chemical vapor deposition), or ALD (Atomic layer deposition) may be used to deposit the high-k dielectric material 1002. Excessive high-k gate dielectric material is removed, for example, by polishing such as chemically mechanical polishing (CMP) and/or etching to form high-k gate dielectric layers 1102, 1104 for each fin structure 104 to 114, as shown in FIG. 11. Each high-k gate dielectric layer 1102, 1104 is formed on and in contact with sidewalls of a fin structure 104 to 114 and a top surface of the bottom spacer 1002. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k layers 1102, 1104 may further include dopants such as (but not limited to) lanthanum or aluminum.

In one embodiment, the high-k layers 1102, 1104 are part of a layer comprising a work function metal layer (not shown). In one embodiment, the work function metal layers are formed after and conformal to the high-k layers 1102, 1104 employing CVD, sputtering, or plating. The work function metal layers comprise one or more metals having a function suitable to tune the work function of nFETs or pFETs. Exemplary first metals that can be employed in the work function metal layer include, but are not limited to La, Ti, and Ta. The gate work function metal layer can be a metallic compound, including but not limited to: titanium nitride (TiN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN)), titanium carbide (TiC), titanium aluminum carbide (TiAlC), tantalum carbide (TaC), and hafnium carbide (HfC) and combinations thereof. The thickness of the work function metal layers may be from 3 nm to 15 nm, although lesser and greater thicknesses can also be employed. The gate layers 155 further include a gate conductor including, but not limited to amorphous silicon (a-Si), or metals, such as, for example, tungsten, cobalt, zirconium, tantalum, titanium, aluminum, ruthenium, copper, metal carbides, metal nitrides, transition metal aluminides, tantalum carbide, titanium carbide, tantalum magnesium carbide, or combinations thereof.

FIG. 11 further shows that a metal gate 1106, 1108 is formed around each of the fin structures 104 to 114. For example, a metal gate material may be deposited by atomic layer deposition (ALD) or physical vapor deposition (PVD). In one embodiment, the metal gate 1106, 1108 may be a continuous metal gate that wraps around all the fins 104 to 114. In another embodiment, individual metal gates may be formed for each fin structure 104 to 114. The metal gate 1106, 1108 contacts the outer sidewalls of the high-k gate dielectric layers 1102, 1104 and a top surface of portions of horizontal portions of the high-k gate dielectric layers 1102, 1104 that are in contact with the bottom source/drain layer 702, 704. In one embodiment, the metal gate 1106, 1108 comprises, for example, tungsten. In one embodiment, the metal gate 1106, 1108 is formed such that a portion of the gate extends laterally beyond the fin to form contact area. The high-k dielectric layers 1102, 1104 and the metal gates 1106, 1108 may then be recessed by an etching process such that the top surfaces of these layers are co-planer with each other and below a top surface of the fin structures 104 to 114. This process exposes a portion of the sidewalls of the fin structures 104 to 114. A top surface and sidewalls of the cap layers 116 to 126 are also exposed.

Figure 12:
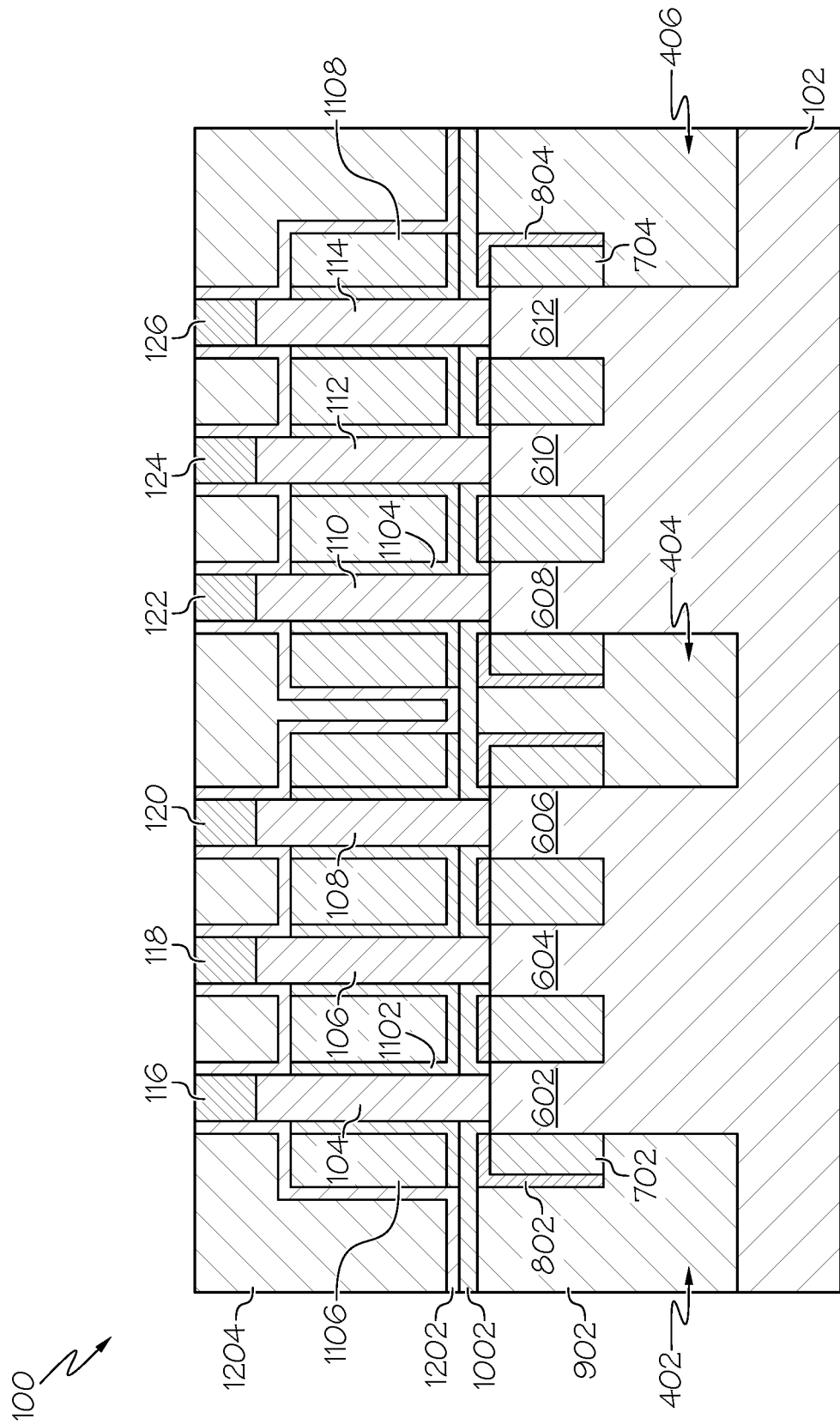
FIG. 12 is a cross-sectional view of the semiconductor structure after a top spacer layer has been formed and an interlayer dielectric material has been deposited according one embodiment of the present disclosure.

After the metal gates 1106, 1108 have been formed they are encapsulated, as shown in FIG. 12. For example, a conformal protective liner 1202 such as (but not limited to) silicon nitride is formed over the structure. In one embodiment, the protective liner 1202 acts as a top spacer layer. After the protective liner 1202 is formed, an inter-layer dielectric (ILD) layer 1204 is deposited on and in contact with the protective liner 1202. A chemical mechanical planarization (CMP) process polishes the protective liner 1202 and ILD 1204 down to the top surface of the capping layers 116 to 126. In some embodiments, a portion of the capping layer 116 to 126 may also be polished as well. The protective liner 1202 contacts the top surface of the bottom spacer; sidewalls of portions of the high-k layers 1102, 1104 in contact with the bottom source/drain layer 702, 704; sidewalls of the metal gates 1106, 1108; the top surfaces of the high-k layers 1102, 1104 and metal gates 1106, 1108; the exposed portions of sidewalls of the fin structures 104 to 114; and sidewalls of the capping layers 116 to 126. The ILD 1204 contacts the sidewalls of the protective liner 1202.

Figure 13:
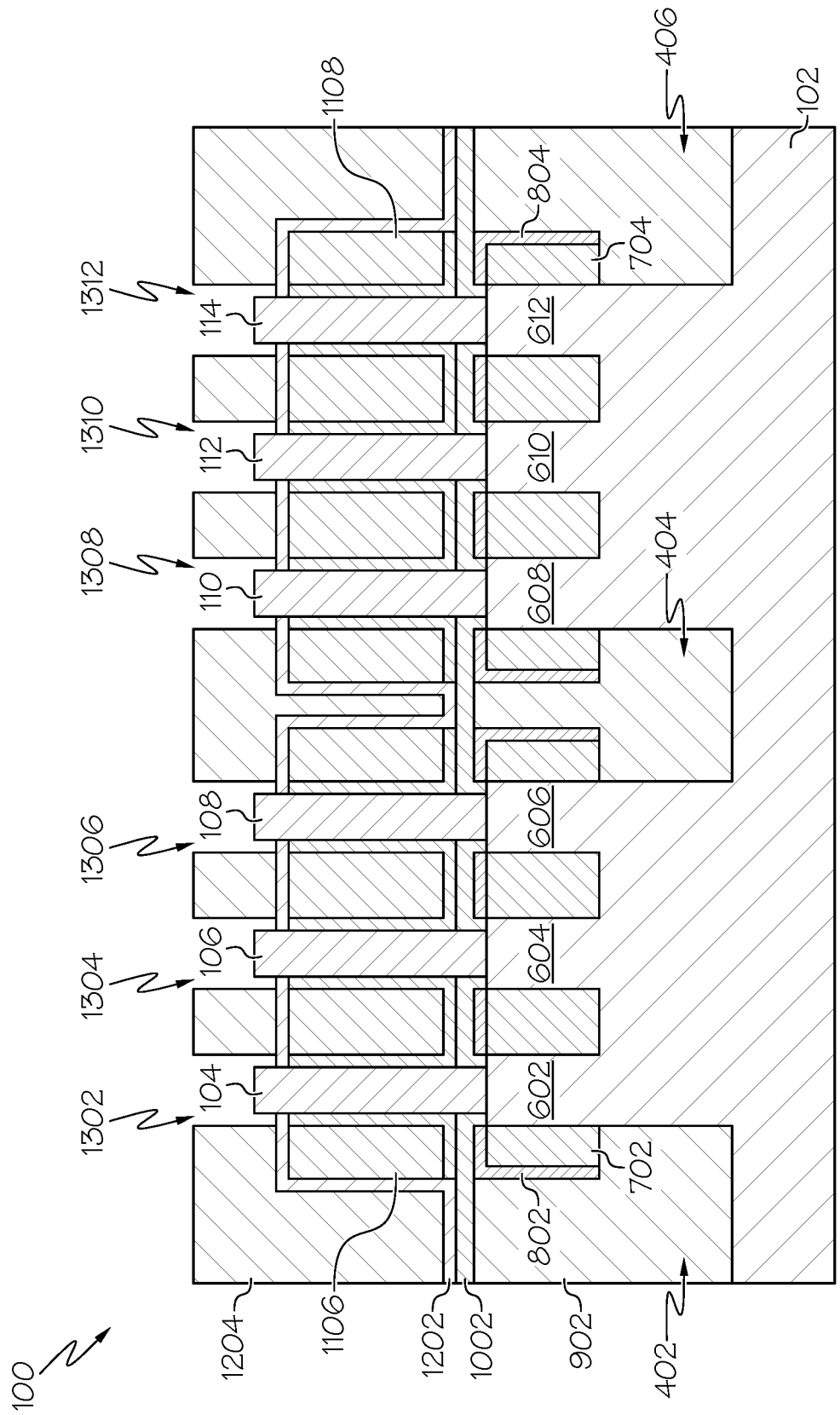
FIG. 13 is a cross-sectional view of the semiconductor structure after trenches have been formed for top source/drains according one embodiment of the present disclosure.

After the ILD layer 1204 is formed, the capping layers 116 to 126 and the vertical portions of the protective liner 1202 that are in contact with sidewalls of both capping layers and fin structures 104 to 114 are removed, as shown in FIG. 13. For example, a selective etching process such as a wet etch process containing phosphoric acid may be used to etch away the capping layers 116 to 126 and the portions of the protective liner 1202 This forms trenches 1302 to 1312 within the ILD layer 1204.

Figure 14:
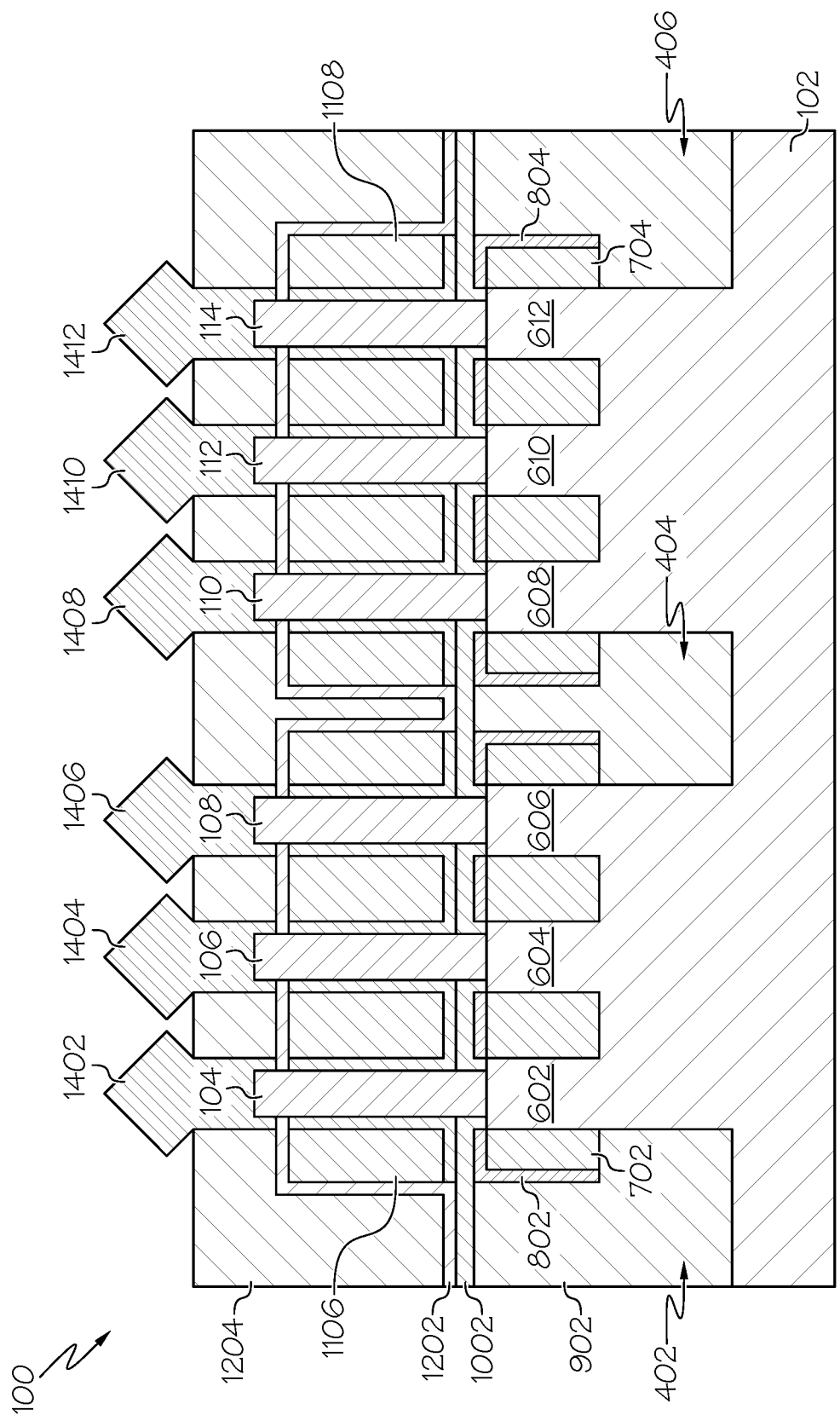
FIG. 14 is a cross-sectional view of the semiconductor structure after top source/drains have been formed according one embodiment of the present disclosure.

Doped layers 1402 to 1412 (also referred to herein as "top source/drain layers 1402 to 1412") are then formed using an epitaxy process, as shown in FIG. 14. For example, epitaxy that is selective with respect to the ILD layer 1204 and protective liner 1202 is used to grow material from the exposed portion of the fin structures 104 to 114 for form the top source/drain layers 1402 to 1412. The top source/drain layers 1402 to 1412 may comprise in-situ doping (boron, in one embodiment for pFET and phosphorus, in one embodiment, for nFET). It should be noted that, according to one embodiment, the top source/drain layers 1402 to 1412 may not contain any doping. Doping may be performed using any standard approach such as ion implantation. In particular, due to the slower growth rates on (111) orientated surface during the epitaxial growth so that faceted top source/drain layers 1402 to 1412 are obtained As shown in FIG. 14, the top source/drain layers 1402 to 1412 comprise angled sides. In some embodiments, the top/source drain layers 1402 to 1412 comprise a diamond shape. The epitaxial growth of diamond shaped epitaxy is self-limiting to the outer <111> plane resulting in diamond outer periphery. It should be noted that, non-faceted epitaxy and/or multiple epitaxy steps can be used to form the top source/drain layers 1402 to 1412 without limiting the scope of the present disclosure. It should also be noted that, in some embodiments, the top/source drain layers 1402 to 1412 may be merged.

The top source/drain layers 1402 to 1412 may be formed up from the fin structures 104 to 114 within the trenches 1302 to 1312 and extend above and laterally beyond the trenches. In one embodiment, a bottom surface of the top source/drain layers 1402 to 1412 contacts a top surface of the fin structures 104 to 114 and a top surface of the protective liner 1202. A top portion 1414 of the top source/drain layers 1402 to 1412 extends above and laterally beyond the trenches 1302 to 1312, and further contacts a top surface of the ILD layer 1204. Conventional fabrication processes such as contact formation may then be performed to complete the device.

Figure 15:
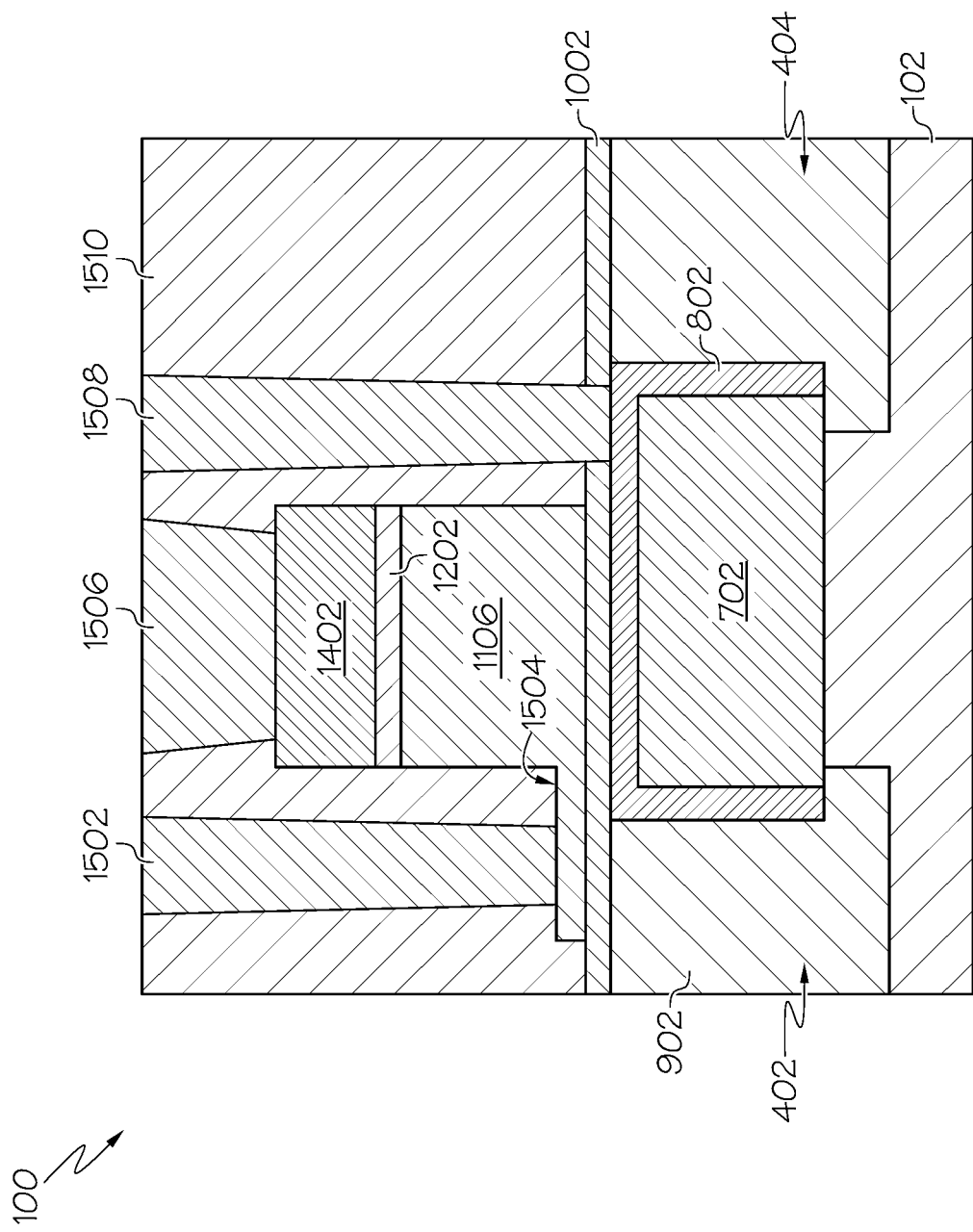
FIG. 15 is a cross-sectional view of the semiconductor structure taken parallel to a fin after metal contacts have been formed according one embodiment of the present disclosure.

FIG. 15 shows a cross-sectional view of the structure 100, which is taken parallel to a fin structure, after a process for forming contacts has been performed. In particular, FIG. 15 shows the gate 1106 wrapping around its fin structure, and the silicide 802 covering exposed portions of the substrate 102 and wrapping around the bottom source/drain layer 702. By having the silicide wrap around the bottom source/drain 702 the contact area between the silicide 802 and the bottom source/drain 702 is increased, which reduces the contact resistance of the bottom source/drain 702. FIG. 15 further shows a first metal contact 1502 formed in contact with the contact area 1504 of the gate 1106; a second metal contact 1506 formed in contact with the top source/drain layer 1402; and a third metal contact 1508 formed in contact with a portion of the silicide 802.

The contacts 1502, 1506, 1508 may be formed by depositing an interlayer dielectric material 1510 is deposited over the structure 100 such that the interlayer dielectric 1510 includes a top surface that extends above the top surface over the top source/drain layer 1402. The dielectric layer 1510 may then be patterned and etched to form a vias/trenches down to and exposing the gate contact area 1504; a top surface of the top source/drain layer 1402; and a top surface of a portion of the silicide layer 802. Conductive material is then deposited into the trenches to form the contacts 1502, 1506, 1508. The contacts may be formed using a process such as CVD, PVD, ALD, or electroplating processes or some combination of these processes. The conductive metal can include, but is not limited to, tungsten, cobalt, copper, aluminum, silver, gold and alloys thereof.

Figure 16:
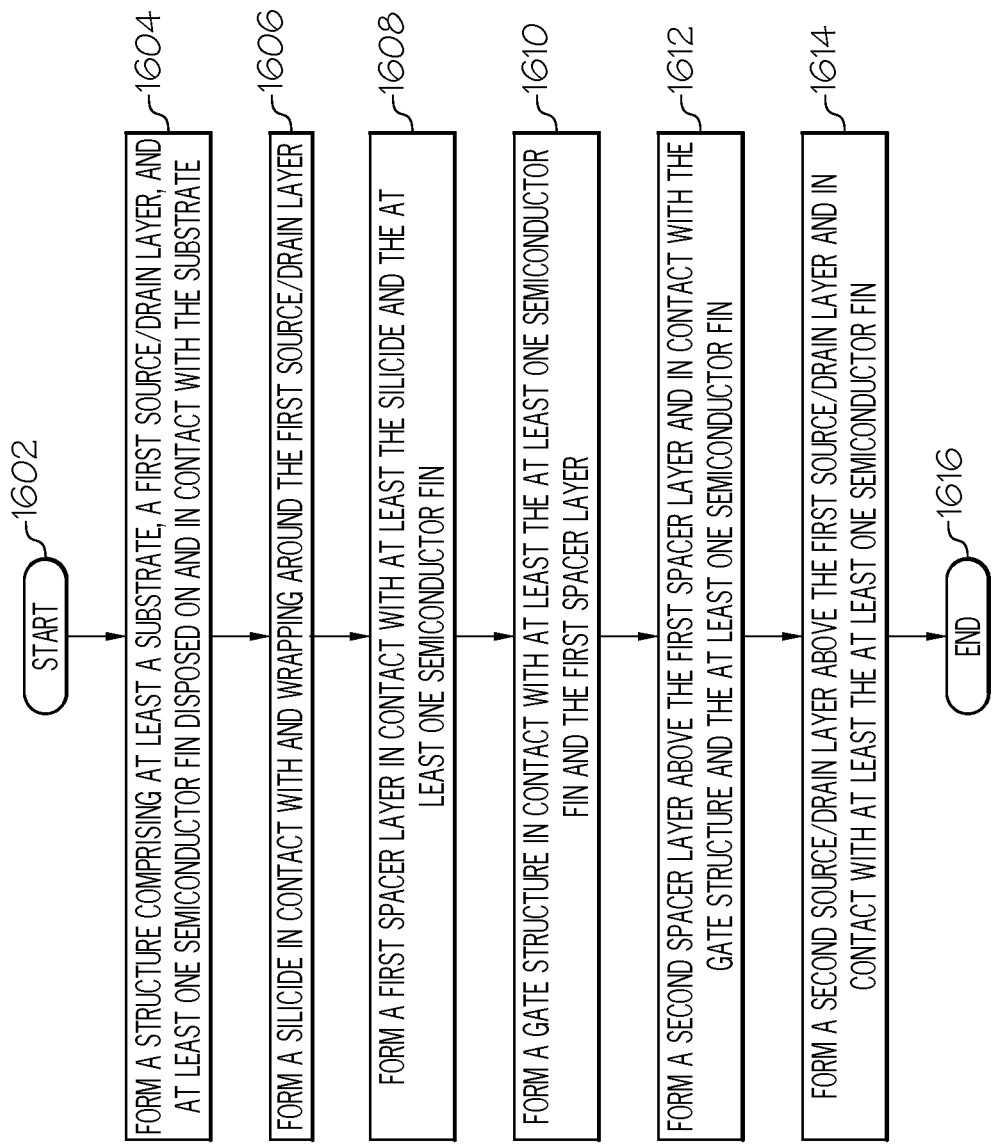
FIG. 16 is an operational flow diagram illustrating one example of a process for forming a semiconductor structure having silicide wrapping around a bottom source/drain layer according one embodiment of the present disclosure.

FIG. 16 is an operational flow diagram illustrating one example of a process for forming a semiconductor structure having silicide wrapping around a bottom source/drain layer according one embodiment of the present disclosure. It should be noted that each of the steps shown in FIG. 16 has been discussed in greater detail above with respect to FIGS. 1 to 15. A structure, at step 1604, is formed comprising at least a substrate, a first source/drain layer, and at least one semiconductor fin disposed on and in contact with substrate. A silicide, at step 1606, is formed silicide in contact with and wrapping around the first source/drain layer. A first spacer layer, at step 1608, is formed in contact with at least the silicide and the at least one semiconductor fin. A gate structure, at step 1610, is formed in contact with at least the at least one semiconductor fin and the first spacer layer. A second spacer layer, at step 1612, is formed above the first spacer layer and in contact with the gate structure and the at least one semiconductor fin. A second source/drain layer, at step 1614, is formed above the first source/drain layer and in contact with at least the at least one semiconductor fin. Additional fabrication processes may then be performed, where the control flow then exits at step 1616.

Although specific embodiments have been disclosed, those having ordinary skill in the art will understand that changes can be made to the specific embodiments without departing from the spirit and scope of the disclosure. The scope of the disclosure is not to be restricted, therefore, to the specific embodiments, and it is intended that the appended claims cover any and all such applications, modifications, and embodiments within the scope of the present disclosure.

It should be noted that some features of the present disclosure may be used in one embodiment thereof without use of other features of the present disclosure. As such, the foregoing description should be considered as merely illustrative of the principles, teachings, examples, and exemplary embodiments of the present disclosure, and not a limitation thereof.

Also note that these embodiments are only examples of the many advantageous uses of the innovative teachings herein. In general, statements made in the specification of the present application do not necessarily limit any of the various claimed disclosures. Moreover, some statements may apply to some inventive features but not to others.

What is claimed is:

1. A method for forming a semiconductor structure, the method comprising at least:
   forming a structure comprising at least a substrate, a first source/drain layer, and at least one semiconductor fin disposed on and in contact with substrate;
   forming a silicide in contact with and wrapping around the first source/drain layer;
   forming a gate structure in contact with at least the at least one semiconductor fin; and
   forming a second source/drain layer above the first source/drain layer.

2. The method of claim 1, further comprising:
   forming a protective layer in contact with sidewalls of the at least one semiconductor fin prior to forming the silicide; and
   removing at least a portion of the protective layer after the silicide has been formed.

3. The method of claim 1, further comprising:
   forming a spacer layer in contact with at least the silicide and the at least one semiconductor fin.

4. The method of claim 3, further comprising:
   forming the spacer layer in contact with a top surface of the substrate.

5. The method of claim 3, further comprising:
   forming an additional spacer layer in contact with the gate structure and the at least one semiconductor fin.

6. The method of claim 1, wherein forming the second source/drain layer comprises:
   forming the second source/drain layer in contact with the gate structure and the at least one semiconductor fin.

7. The method of claim 1, further comprising:
   forming a metal contact in contact with a contact area of the gate structure.

8. The method of claim 1, further comprising:
   forming a metal contact in contact with the second source/drain layer.

9. The method of claim 1, further comprising:
   forming a metal contact in contact with the silicide.

10. A semiconductor structure comprising at least:
    a substrate;
    at least one semiconductor fin contacting the substrate;
    a first source/drain layer contacting the substrate;
    a silicide contacting and wrapping around the first source/drain layer; and
    a second source/drain layer above the first source/drain layer.

11. The semiconductor structure of claim 10, further comprising:
    a spacer layer contacting at least the silicide and the at least one semiconductor fin.

12. The semiconductor structure of claim 11, wherein the spacer layer further contacts a top surface of the substrate.

13. The semiconductor structure of claim 11, further comprising:
    a gate structure contact the at least one semiconductor fin; and
    an additional spacer layer formed above the spacer layer, wherein the additional spacer layer contacts the gate structure and the at least one semiconductor fin.

14. The semiconductor structure of claim 10, wherein the second source/drain layer contacts the at least one semiconductor fin.

15. The semiconductor structure of claim 10, wherein the second source/drain layer comprises a faceted portion.

16. An integrated circuit comprising:
    one or more semiconductor devices, wherein at least one of the one or more semiconductor devices comprises at least:
    a substrate;
    at least one semiconductor fin contacting the substrate;
    a first source/drain layer contacting the substrate;
    a silicide contacting and wrapping around the first source/drain layer; and
    a second source/drain layer above the first source/drain layer.

17. The integrated circuit of claim 16, wherein the at least one of the one or more semiconductor devices further comprises:
    a spacer layer contacting at least the silicide and the at least one semiconductor fin.

18. The integrated circuit of claim 17, wherein the at least one of the one or more semiconductor devices further comprises:
    a gate structure contact the at least one semiconductor fin; and
    an additional spacer layer formed above the spacer layer, wherein the additional spacer layer contacts the gate structure and the at least one semiconductor fin.

19. The integrated circuit of claim 16, wherein the second source/drain layer contacts the at least one semiconductor fin.

20. The integrated circuit of claim 16, wherein the second source/drain layer comprises a faceted portion.

* * * * *